United States Patent
Patil et al.

(10) Patent No.: US 9,502,301 B2
(45) Date of Patent: Nov. 22, 2016

(54) FABRICATION METHODS FOR MULTI-LAYER SEMICONDUCTOR STRUCTURES

(71) Applicant: GLOBALFOUNDRIES Inc., Grand Cayman (KY)

(72) Inventors: Suraj K. Patil, Ballston Lake, NY (US); Min-hwa Chi, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/730,614

(22) Filed: Jun. 4, 2015

(65) Prior Publication Data

US 2016/0190014 A1 Jun. 30, 2016

Related U.S. Application Data

(60) Provisional application No. 62/097,306, filed on Dec. 29, 2014.

(51) Int. Cl.

| | | |
|---|---|---|
| *H01L 21/82* | (2006.01) | |
| *H01L 21/285* | (2006.01) | |
| *H01L 21/28* | (2006.01) | |
| *H01L 21/768* | (2006.01) | |
| *H01L 21/8234* | (2006.01) | |
| *H01L 21/283* | (2006.01) | |
| *H01L 21/324* | (2006.01) | |
| *H01L 21/225* | (2006.01) | |

(52) U.S. Cl.
CPC ... *H01L 21/823443* (2013.01); *H01L 21/2253* (2013.01); *H01L 21/283* (2013.01); *H01L 21/285* (2013.01); *H01L 21/28052* (2013.01); *H01L 21/28518* (2013.01); *H01L 21/324* (2013.01); *H01L 21/76889* (2013.01)

(58) Field of Classification Search
CPC ............ H01L 21/2253; H01L 21/283; H01L 21/28518; H01L 21/324; H01L 21/76889; H01L 21/823443; H01L 21/823835; H01L 21/28052; H01L 29/665; H01L 29/7845
See application file for complete search history.

(56) References Cited

U.S. PATENT DOCUMENTS

2014/0110790 A1   4/2014   Huang

OTHER PUBLICATIONS

I. Polishchuk, P. Ranade, Tsu-Jae King, Chenming Hu, "Dual Work Function Metal Gate CMOS Technology Using Metal Inter-diffusion", IEEE EDL, V.22, No. 9, Sep. 2001, 3 pages.
C. Cabral, Jr., 1. Kedzierski, B. Linder, S. Zafar, V. Narayanan, S. Fang*, A. Steegen*, P. Kozlowski, R. Carruthers, and R. Iammy, "Dual Workfunction Fully Silicided Metal Gates", Digest of Technical Papers, Symposium on VLSI Technology, 2004, 2 pages.

*Primary Examiner* — Thanhha Pham
(74) *Attorney, Agent, or Firm* — Heslin Rothenberg Farley & Mesiti P.C.; Nathan Brian Davis

(57) ABSTRACT

Methods are provided for fabricating multi-layer semiconductor structures. The methods include, for example: providing a first layer and a second layer over a substrate, the first layer including a first metal and the second layer including a second metal, where the second layer is disposed over the first layer and the first metal and second metal are different metals; and annealing the first layer, the second layer, and the substrate to react at least a portion of the first metal of the first layer to form a first reacted layer and at least a portion of the second metal of the second layer to form a second reacted layer, where at least one of the first reacted layer or the second reacted layer includes at least one of a first metal silicide of the first metal or a second metal silicide of the second metal.

18 Claims, 13 Drawing Sheets

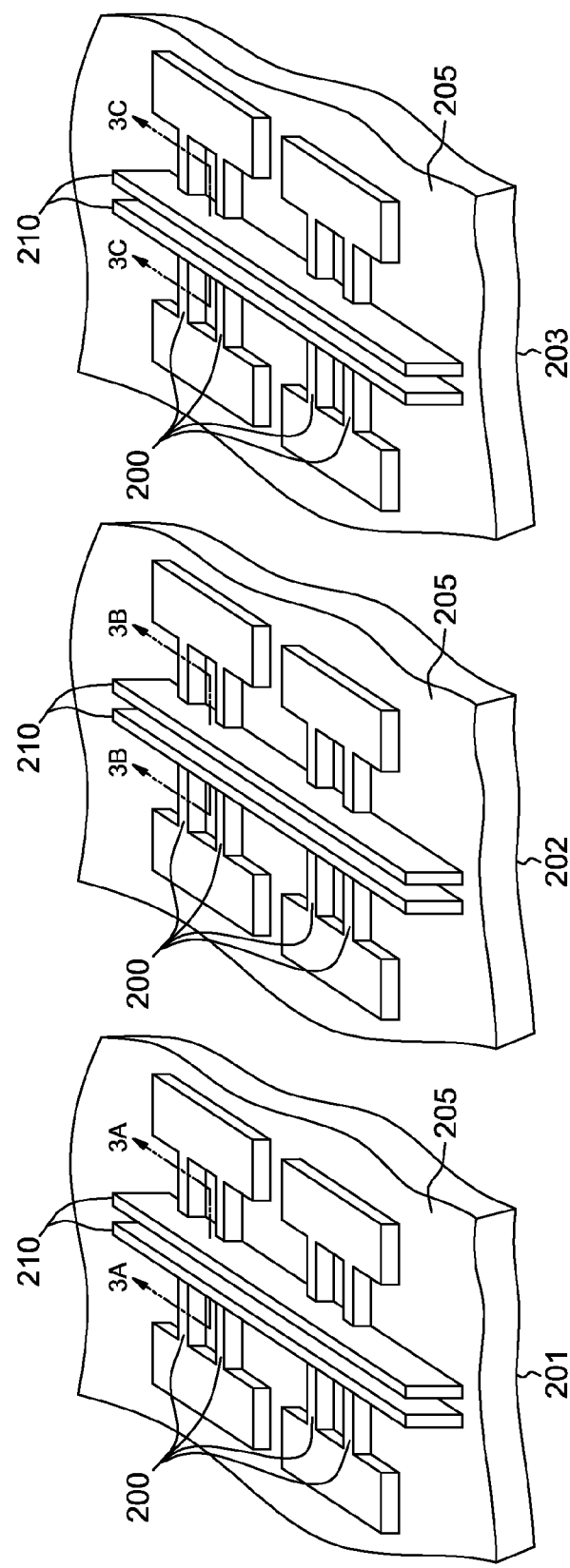

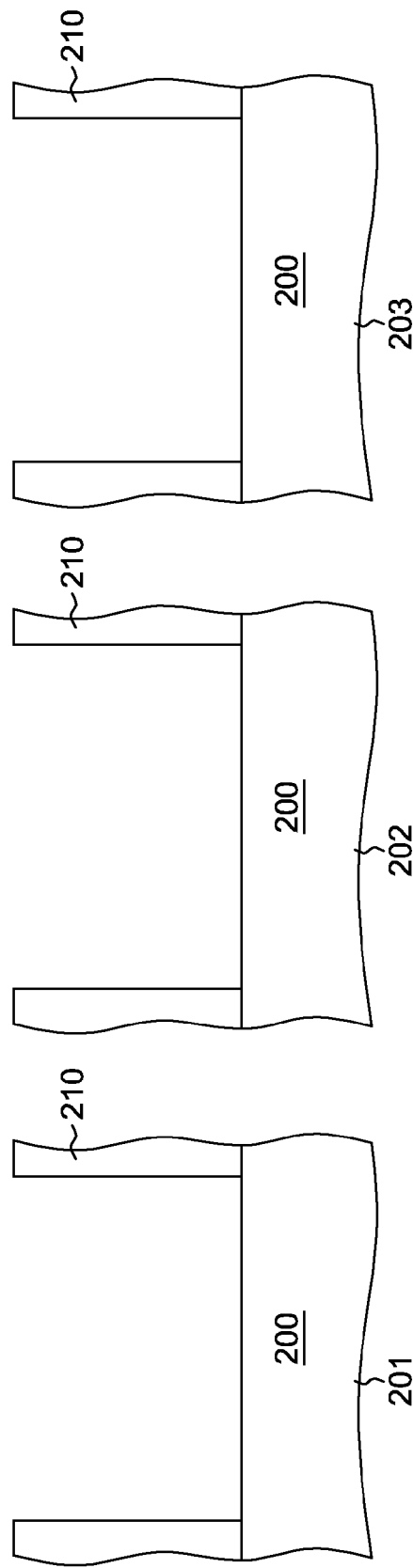

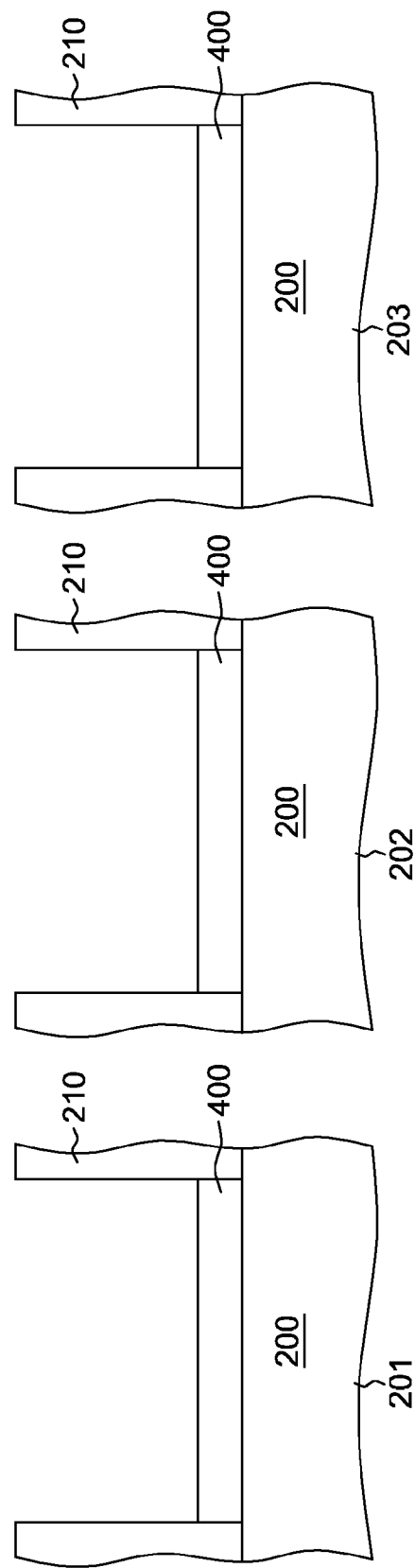

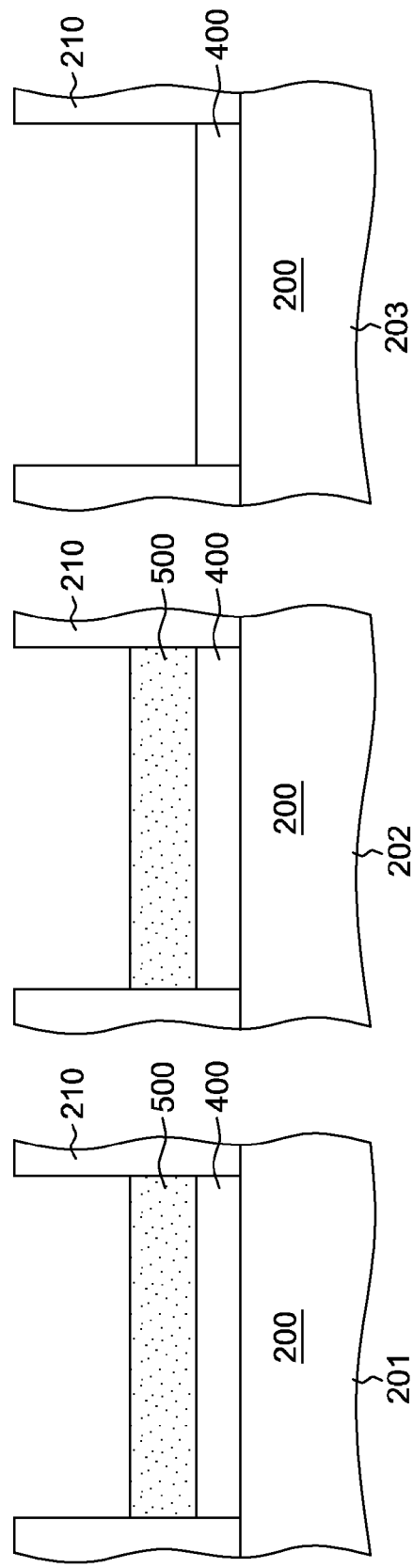

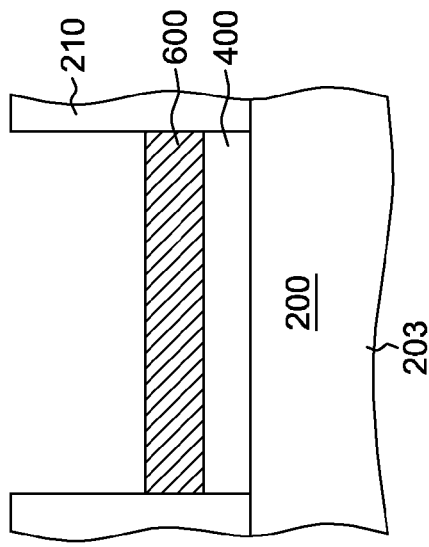
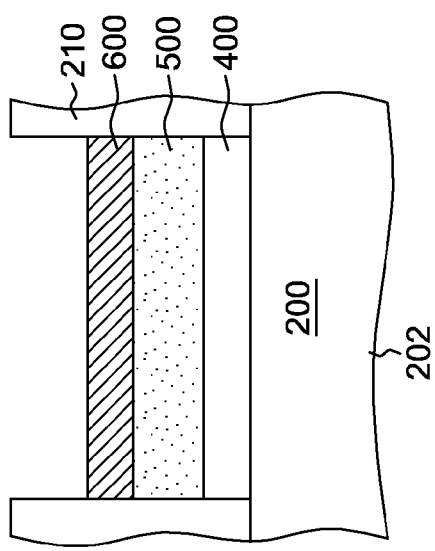
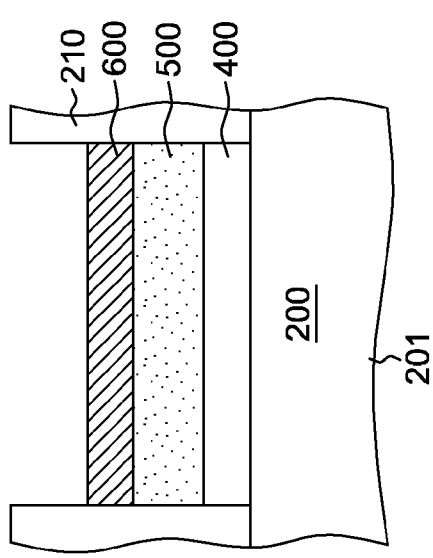

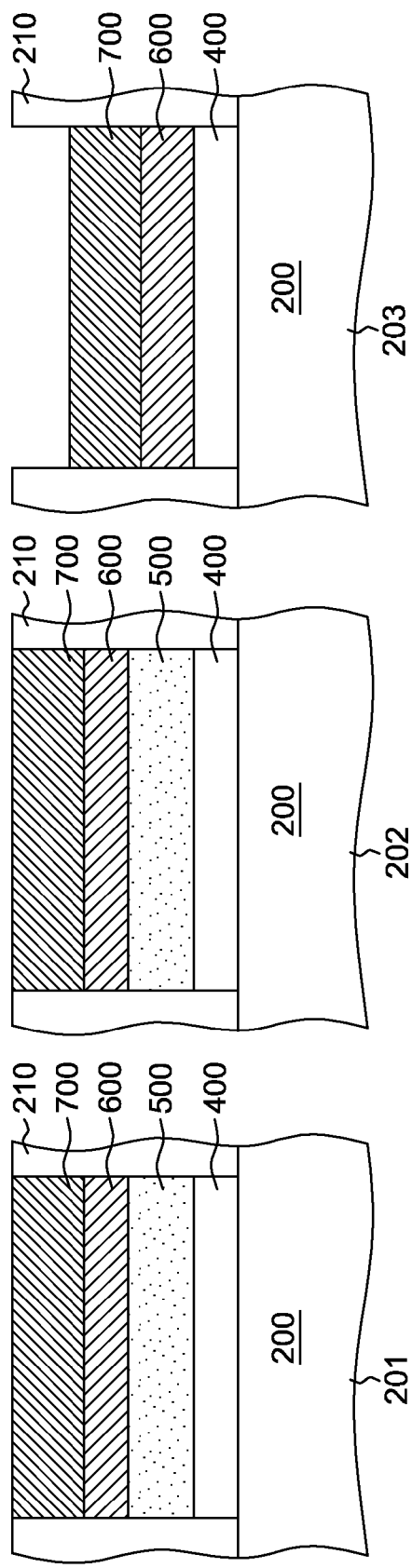

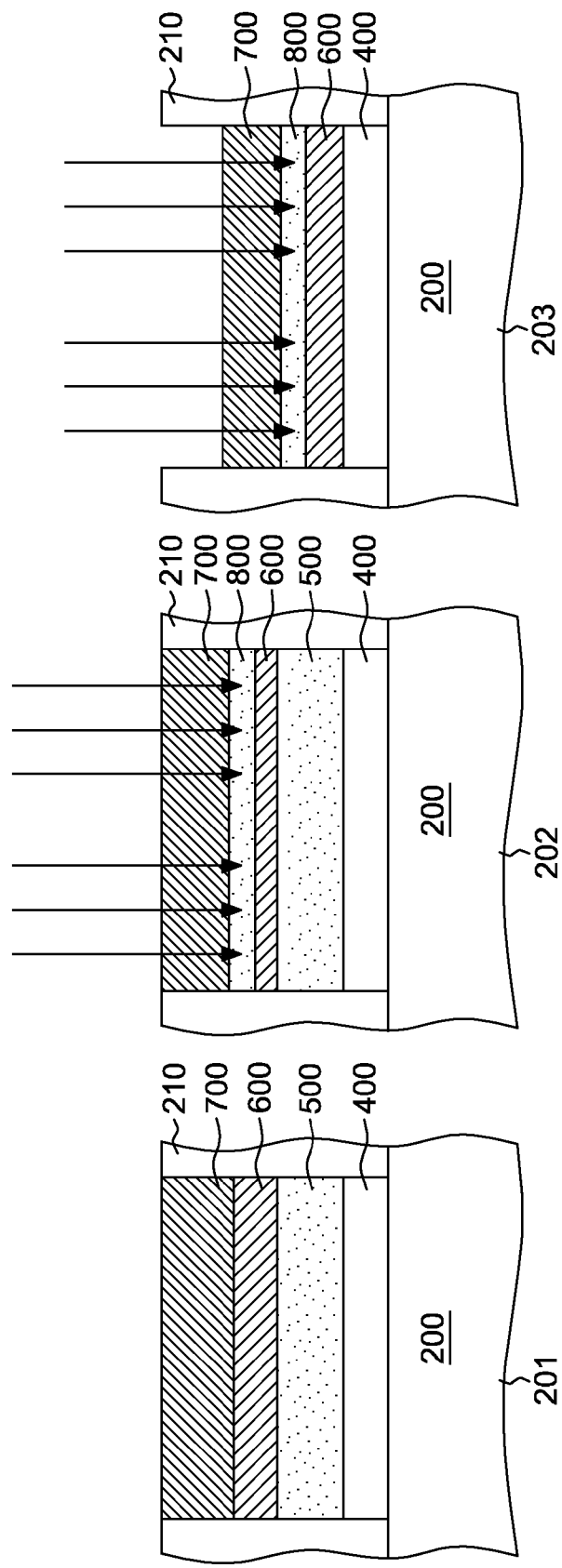

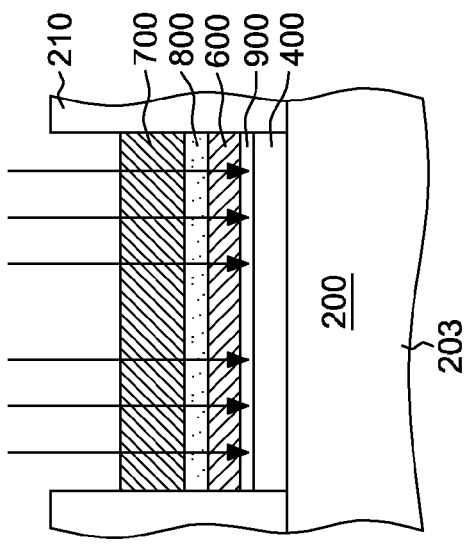
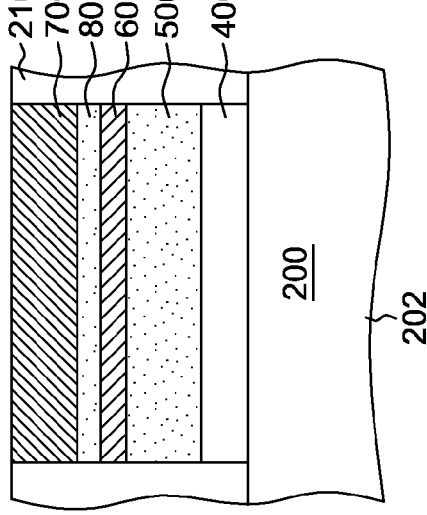
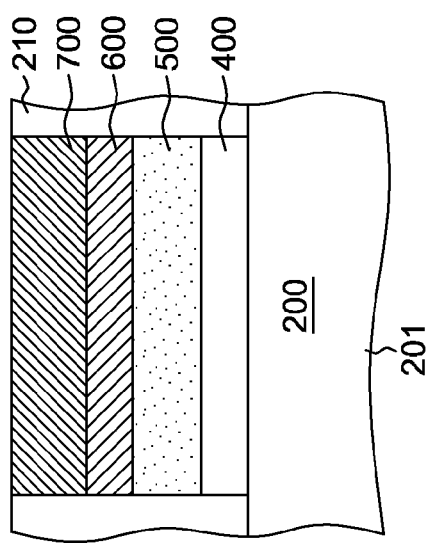
FIG. 9C
FIG. 9B
FIG. 9A

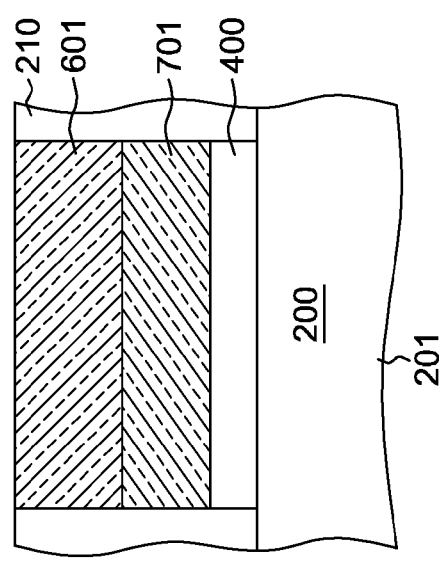
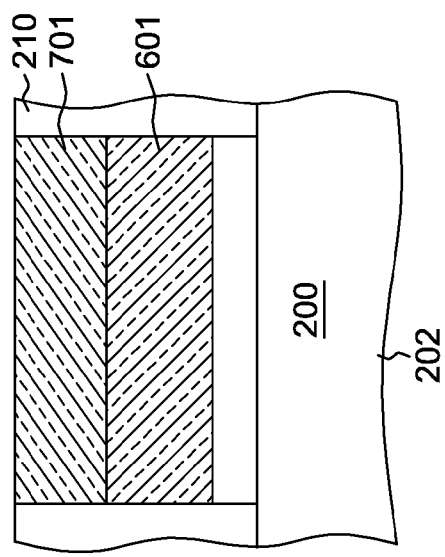
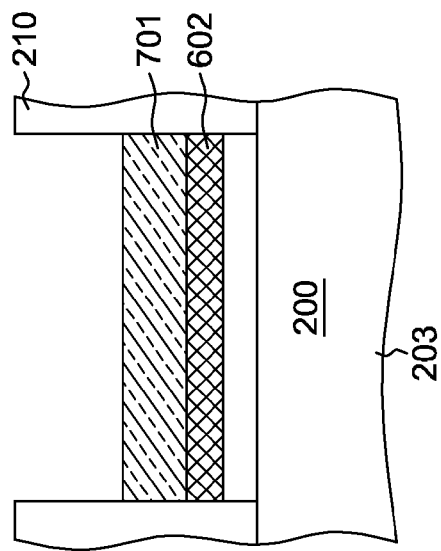

FABRICATION METHODS FOR MULTI-LAYER SEMICONDUCTOR STRUCTURES

CROSS-REFERENCE TO RELATED APPLICATION

This application claims the benefit of U.S. Provisional Patent Application No. 62/097,306, filed Dec. 29, 2014, which is hereby incorporated herein by reference in its entirety.

FIELD OF THE INVENTION

The present invention relates to semiconductor structures, and methods of fabricating semiconductor structures, and more particularly to fabrication methods for multi-layer semiconductor structures.

BACKGROUND OF THE INVENTION

Complementary metal-oxide-semiconductor (CMOS) technology continues to be an extremely important technology for the fabrication of integrated circuits. In CMOS technology, both p-type devices, such as p-type field-effect transistors, and n-type devices, such as n-type field effect transistors, are fabricated on a common semiconductor wafer.

Different processes or materials can be required in the fabrication of p-type devices and n-type devices. For example, forming p-type transistors and n-type transistors with matched threshold voltages can require the use of multiple different gate structure formation processes or work function layers, thereby increasing complexity and costs.

BRIEF SUMMARY

The shortcomings of the prior art are overcome, and additional advantages are provided, through the provision, in one aspect, of a method for fabricating a semiconductor structure. The method includes: providing a first layer and a second layer over a substrate, the first layer including a first metal and the second layer including a second metal, wherein the second layer is disposed over the first layer and the first metal and second metal are different metals; and annealing the first layer, the second layer, and the substrate to react at least a portion of the first metal of the first layer to form a first reacted layer and at least a portion of the second metal of the second layer to form a second reacted layer, where at least one of the first reacted layer or the second reacted layer includes at least one of a first metal silicide of the first metal or a second metal silicide of the second metal.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 2A is an isometric view of a first region of a semiconductor structure, in accordance with one or more aspects of the present invention;

FIG. 2B is an isometric view of a second region of the semiconductor structure, in accordance with one or more aspects of the present invention;

FIG. 2C is an isometric view of a third region of the semiconductor structure, in accordance with one or more aspects of the present invention;

FIGS. 3A-3C are cross-sectional elevational views of the semiconductor structure of FIGS. 2A-2C taken along lines 3A-3C thereof, in accordance with one or more aspects of the present invention;

FIGS. 4A-4C illustrate the semiconductor structure of FIGS. 3A-3C after providing a dielectric layer over a substrate thereof, in accordance with one or more aspects of the present invention;

FIGS. 5A-5C illustrate the semiconductor structure of FIGS. 4A-4C after providing a semiconductor layer above the substrate in the first and second regions thereof, in accordance with one or more aspects of the present invention;

FIGS. 6A-6C illustrate the semiconductor structure of FIGS. 5A-5C after providing a first layer above the substrate thereof, in accordance with one or more aspects of the present invention;

FIGS. 7A-7C illustrate the semiconductor structure of FIGS. 6A-6C after providing a second layer above the substrate thereof, in accordance with one or more aspects of the present invention;

FIGS. 8A-8C illustrate the semiconductor structure of FIGS. 7A-7C after implanting silicon at least partially within the first layer and the second layer in the second and third regions thereof, in accordance with one or more aspects of the present invention;

FIGS. 9A-9C illustrate the semiconductor structure of FIGS. 8A-8C after implanting nitrogen at least partially within the first layer and the second layer in the third region thereof, in accordance with one or more aspects of the present invention;

FIGS. 11A-11C illustrate the semiconductor structure of FIGS. 10A-10C after annealing at a second temperature the first layer and the second layer thereof, in accordance with one or more aspects of the present invention.

DETAILED DESCRIPTION

Figure 1A:
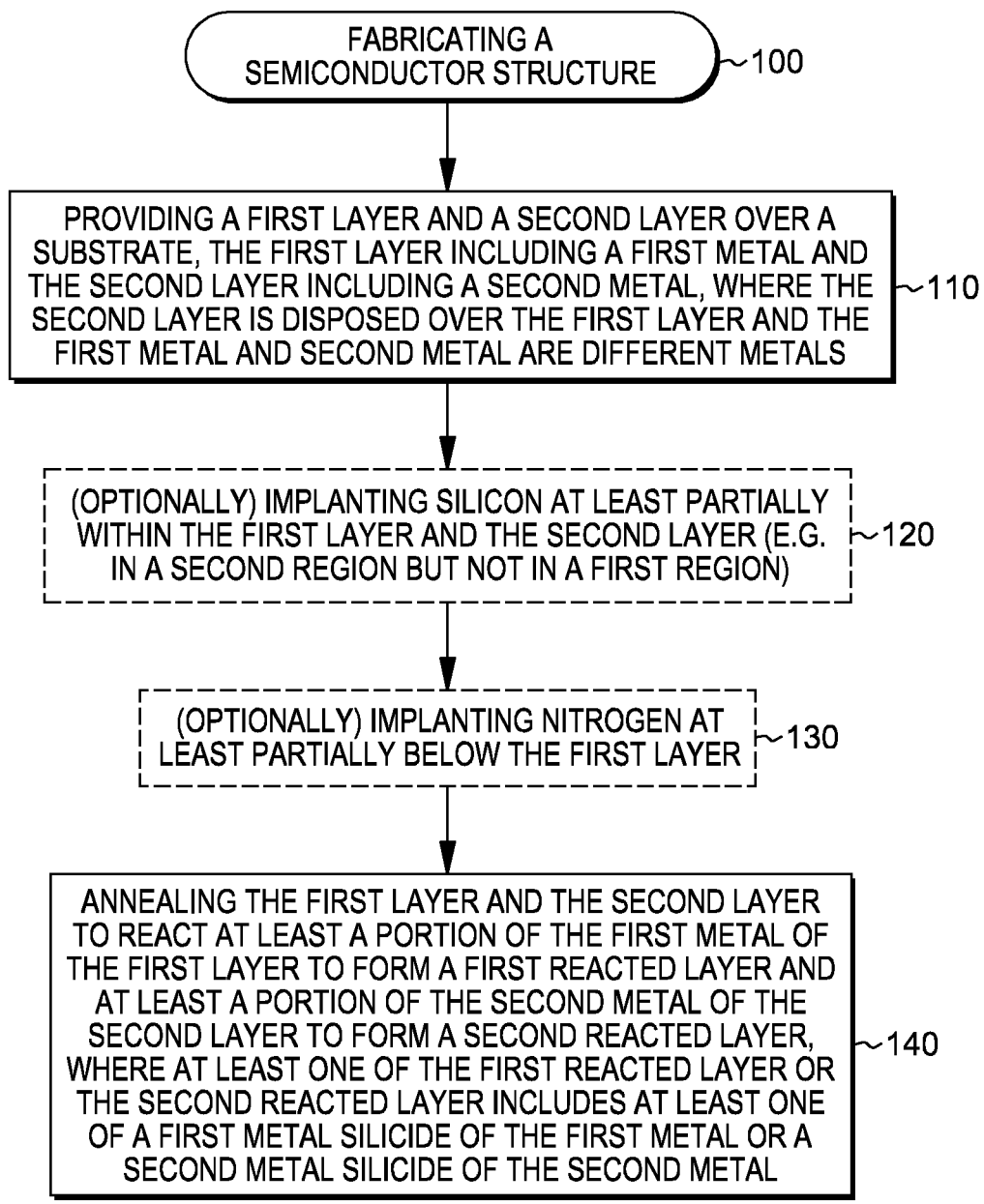
FIGS. 1A-1B depict embodiments of processes for fabricating semiconductor structures, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure provides, in part, fabrication methods for multi-layer semiconductor structures. During the fabrication of integrated circuits, different processes and/or materials can be required for p-type devices and n-type devices for a variety of reasons. For example, materials used to fabricate gate structures for field-effect transistors can influence the threshold voltage of the transistors due to different work functions of the materials.

For a conductor, the work-function is an electrical property that describes the minimum energy required to remove an electron from the conductor. The work-function of a material layer of a gate structure, therefore, impacts the threshold voltage of a transistor because it influences the amount of energy required for electrons to flow from the gate stack to a gate contact, and thereby influences the amount of energy available to attract charge carriers in a channel underlying the gate. In such an example, different materials can be required to provide the appropriate work functions for p-type field-effect transistors and n-type field effect transistors, because of different electrical properties of p-type and n-type materials. Depending on the application, it can be important to ensure that the threshold voltages of p-type and n-type transistors are matched closely, necessitating use of the appropriate materials of the gate structures for p-type and n-type transistors.

For instance, in one example, work function layers can be fabricated separately for p-type and n-type regions, by masking off one region during fabrication processing of the other regions. However, such techniques require multiple mask steps, increasing fabrication complexity and cost, and can also decrease yield due to flaws introduced during repeated processing. In addition, as critical dimensions of integrated circuits continue to become smaller, photolithographic techniques may not provide precise enough alignment and process control. Further, each step of masking and removing the mask can potentially lead to damage of the fabricated structures, thereby reducing yield. Therefore, a need exists for fabrication methods appropriate for reduced critical dimensions and capable of accommodating both p-type and n-type devices, without including a series of additional masking steps, Reference is made below to the drawings, which are not drawn to scale for ease of understanding, wherein the same reference numbers used throughout different figures designate the same or similar components.

Figure 1B:
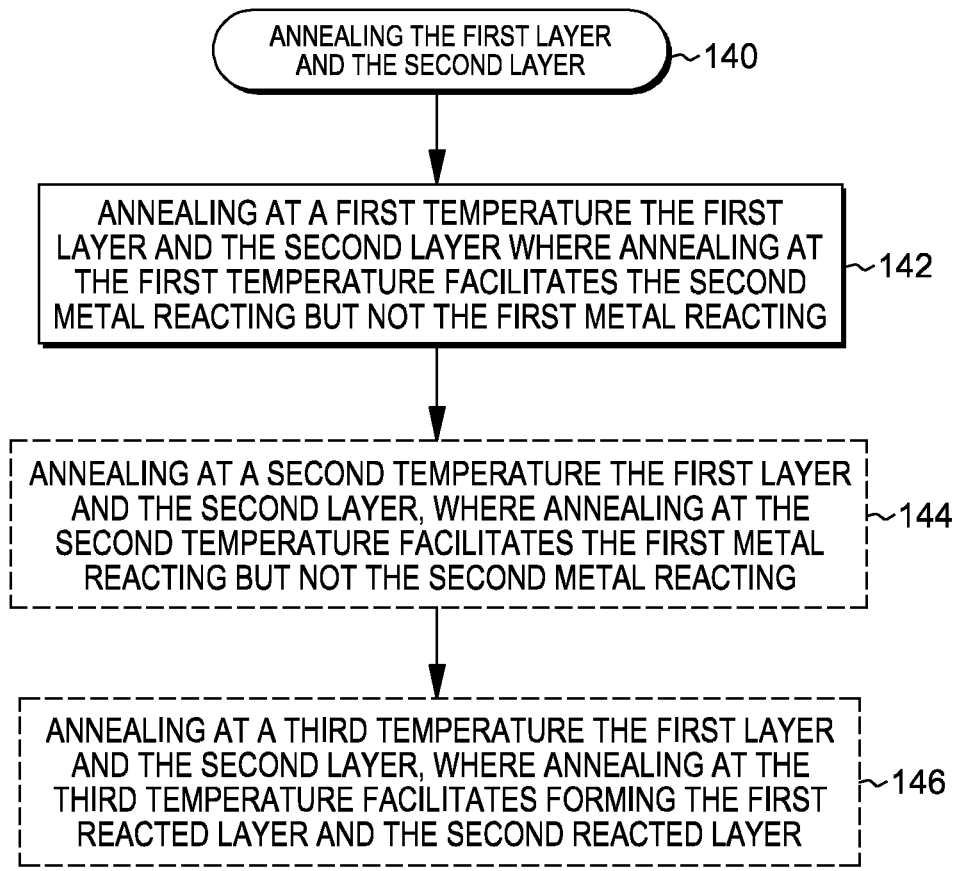

FIGS. 1A-1B depict embodiments of processes for fabricating semiconductor structures, in accordance with one or more aspects of the present invention. With reference to FIG. 1A, in one embodiment, fabricating a semiconductor structure 100 includes: providing a first layer and a second layer above a substrate, the first layer including a first metal and the second layer including a second metal, where the second layer is disposed over the first layer and the first metal and second metal are different metals 110; and annealing the first layer and the second layer to react at least a portion of the first metal of the first layer to form a first reacted layer and at least a portion of the second metal of the second layer to form a second reacted layer, where at least one of the first reacted layer or the second reacted layer includes at least one of a first metal silicide of the first metal or a second metal silicide of the second metal 140.

In another embodiment, for example, the first layer and the second layer can include a first region and a second region, and the method further can further include: implanting, before the annealing, silicon at least partially within the first layer and the second layer (for example, in the second region but not in the first region), wherein the forming comprises forming the first reacted layer over the second reacted layer (for example in the first region) and/or the second reacted layer over the first reacted layer in (for example in the second region), the first reacted layer comprising the first metal silicide and the second reacted layer comprising the second metal silicide 120.

In a further embodiment, the fabricating can further include: fabricating a first transistor in the first region and a second transistor in the second region, the first transistor including a first gate structure and the second transistor including a second gate structure, wherein the first gate structure includes the first reacted layer and the second reacted layer in the first region and the second gate structure includes the first reacted layer and the second reacted layer in the second region. In such a case, for example, the first transistor is a p-type transistor and the second transistor is an n-type transistor, and the second reacted layer in the first region facilitates electrical operation of the p-type transistor and the first reacted layer in the second region facilitates electrical operation of the n-type transistor.

In one implementation, the forming includes forming the first reacted layer over the second reacted layer, the first reacted layer comprising the first metal silicide and the second reacted layer comprising the second metal silicide. In another implementation, the forming further includes forming the first reacted layer to include the first metal silicide.

In a further implementation, the method further includes: implanting, before the annealing, nitrogen at least partially below the first layer, wherein the reacting further includes the at least a portion of the first metal of the first layer reacting with at least some of the nitrogen to form the first reacted layer, the first reacted layer including a first metal nitride of the first metal 130.

In one example, the annealing includes: annealing at a first temperature the first layer and the second layer wherein annealing at the first temperature facilitates the second metal reacting but not the first metal reacting 142. In one case, annealing at the first temperature may facilitate the second metal diffusing through the first layer. In another case annealing at the first temperature facilitates the second metal reacting to form the second metal silicide of the second reacted layer.

In another example, the method further includes: annealing at a second temperature the first layer and the second layer, wherein annealing at the second temperature facilitates the first metal reacting but not the second metal reacting 144. In such a case, in one specific example, the second temperature is greater than the first temperature.

In another specific example, annealing at the second temperature facilitates the first metal diffusing through the second layer. In a further specific example, annealing at the second temperature facilitates the first metal reacting to form the first metal silicide of the first reacted layer.

In a further example, the method further includes: annealing at a third temperature the first layer and the second layer, wherein annealing at the third temperature facilitates forming the first reacted layer and the second reacted layer 146. In another embodiment, the first metal and the second metal are different metals.

In one embodiment, the first metal includes one of titanium or nickel and the second metal includes the other of titanium or nickel. In another embodiment, the first metal silicide includes one of titanium silicide or nickel silicide, and the second metal silicide includes the other of titanium silicide or nickel silicide. In a further embodiment, the first layer includes nickel, the first reacted layer includes nickel silicide, the second layer comprises titanium, and the second reacted layer includes titanium silicide.

FIGS. 2A-2C are isometric views of a semiconductor structure, in accordance with one or more aspects of the present invention. FIG. 2A illustrates a first region 201 of the semiconductor structure, FIG. 2B illustrates a second region 202 of the semiconductor structure, and FIG. 2C illustrates a third region 203 of the semiconductor structure. As illustrated, the semiconductor structure includes numerous semiconductor devices, such as field-effect transistors, each of which include a source region and a drain region separated by a channel region.

By way of explanation, during fabrication processing, a gate structure of the transistor is disposed over the channel region thereof, and controls the current flow between the source region and the drain region. The different regions of the semiconductor device can include multiple different types of transistors, such as p-type or n-type transistors having different threshold voltages. Different types of transistors can require different types of gate structures as explained above, and the techniques described herein can be used to form different gate structures in different regions of the semiconductor structure to accommodate this need.

In addition, multiple different transistors can require multiple different threshold voltages. In operation of a transistor, the threshold voltage is the minimum applied gate voltage required to turn on the transistor, allowing current to flow from a source to a drain through a channel of the transistor. When designing integrated circuits, including, for example, systems on a chip, for use in specific applications, such as mobile phones or media players, it may be desirable to optimize leakage power consumption and speed of the integrated circuit by having different portions of the integrated circuit implemented with transistors having different threshold voltage characteristics.

For example, it may be desirable to perform logic or arithmetic functions at a relatively higher speed to enable advanced features, and to perform memory storage at a relatively lower speed to save power. In another example, even within a single logic subsystem of an integrated circuit, it may be desirable to optimize the speed of certain transistors and optimize the power consumption of other transistors. Controlling for other factors, in general, a transistor with a lower threshold voltage operates faster, but consumes more leakage power, than a transistor with higher threshold voltage. Because of the use of CMOS technology, for each desired threshold voltage, both a p-type and n-type gate structure, tuned to a matched threshold voltage, can be required.

The field effect transistors illustrated in FIGS. 2A-2C are fin-type transistors, in which channel regions include one or more raised fin structures 200 extending from substrate 205. The techniques described herein may be used in conjunction with various transistor types having various gate types, including, for example, planar FETs, silicon on insulator transistors, etc. In addition, the techniques described herein are not limited to the fabrication of gate structures for transistors, and may be used wherever multi-layer semiconductor structures are needed.

To explain the techniques of the present invention, reference will be made to three different illustrated transistors of FIGS. 2A-2C, which have three different gate structures. As may be readily understood from the foregoing discussion, the present techniques may be used to fabricate, for example, three different sets of transistors, where each set of transistors may include thousands, millions, or billions, of transistors having the same or similar gate structure. In such a case, the different sets may be present in overlapping and/or non-overlapping regions of substrate 205.

In the embodiment of FIGS. 2A-2C, the semiconductor structure includes substrate 205. In one example, substrate 205 is a bulk semiconductor material such as a bulk silicon (Si) wafer. In another example, substrate 205 is or includes any silicon-containing substrate material including, but not limited to, single crystal Si, polycrystalline Si, amorphous Si, Si-on-nothing (SON), Si-on-insulator (SOI), or Si-on-replacement insulator (SRI) substrates and the like, and may be n-type or p-type doped as desired for a particular application. In another example, substrate 205 may be, for instance, a wafer that is approximately 600-700 micrometers thick. In another example, substrate 205 may include other suitable elementary semiconductors, such as, for example, germanium (Ge) in crystal, or a compound semiconductor such as silicon carbide (SiC), gallium arsenide (GaAs), gallium phosphide (GaP), indium phosphide (InP), indium arsenide (InAs), and/or indium antimonide (InSb) or combinations thereof. In a further example, substrate 200 can include an alloy semiconductor including GaAsP, AlinAs, GaInAs, GaInP, $Si_{1-x}Ge_x$ or GaInAsP or combinations thereof.

In one embodiment, fin structures 200 extend from substrate 205. By way of example, fin structures 200 may be formed by removing one or more portions of the substrate to create the fins from the same material as the substrate. In one example, formation of fins may be achieved by patterning the substrate using any of various approaches, including: direct lithography; sidewall image transfer technique; extreme ultraviolet lithography (EUV); e-beam technique; litho-etch litho-etch; or litho-etch litho-freeze. Following patterning, material removal may be performed, for example, by any suitable etching process, such as an anisotropic dry etching process, for instance, reactive-ion-etching (RIE) in sulfur hexafluoride ($SF_6$), or tetrafluoromethane ($CF_4$) based chemistries. Although the following numbers are relative and the heights could vary, as one specific example, fins may have a height of about 40 nanometers, and a length of about one micrometer, several micrometers, or the diameter of the entire wafer, and the thickness of fins may be approximately 10 nanometers or less. In another example, the fins may be formed on the substrate, and the fins and the substrate may be of different materials.

Figure 2D:
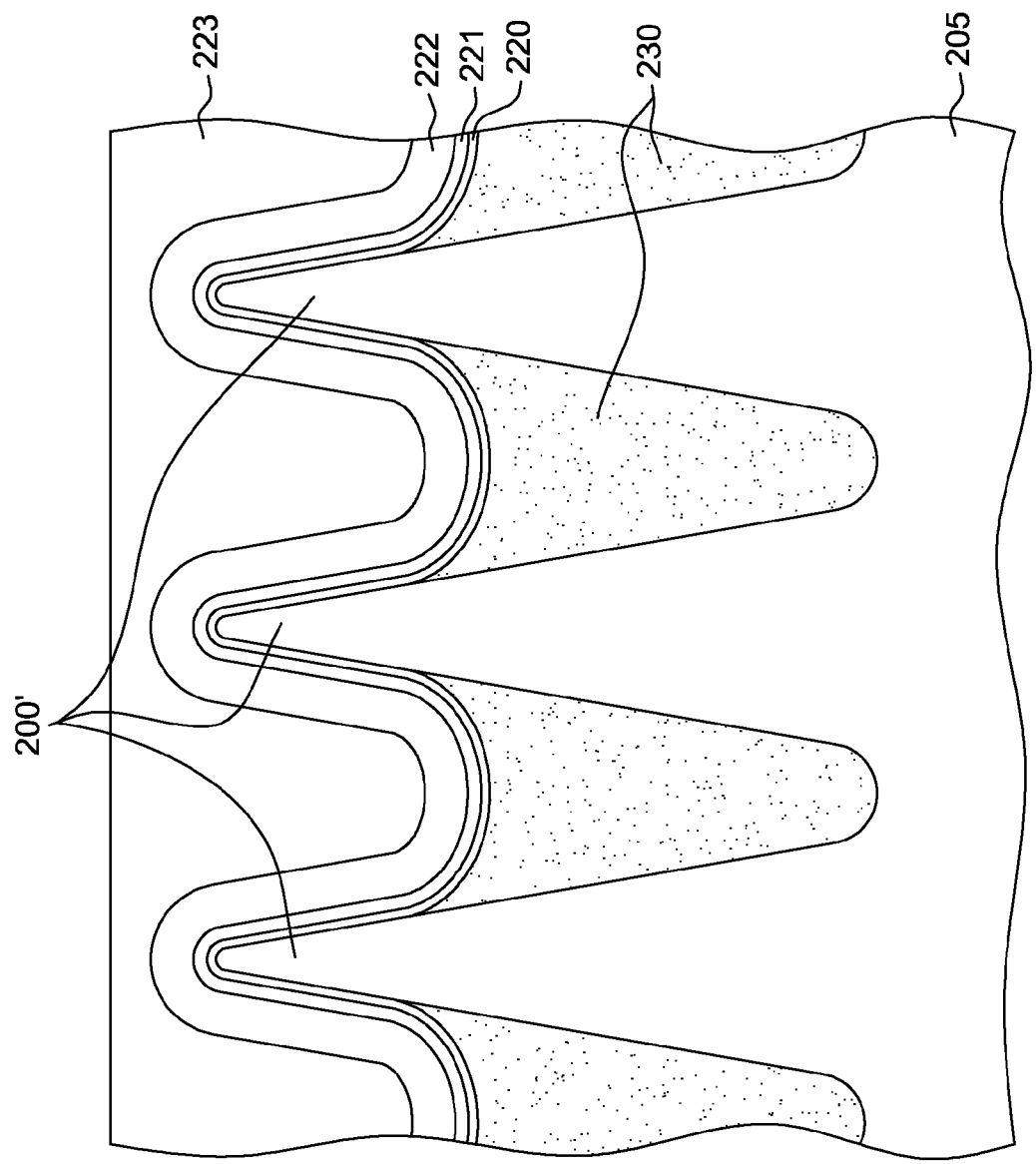
FIG. 2D is a cross-sectional elevational view of a semiconductor structure, in accordance with one or more aspects of the present invention.

FIG. 2D is a cross-sectional elevational view of a semiconductor structure, in accordance with one or more aspects of the present invention. In the embodiment of FIG. 2D, a completed gate structure in accordance with the present technique is depicted, and wraps conformally up and over multiple fins 200'.

As with the structure of FIGS. 2A-2C, in the embodiment of FIG. 2D, multiple fins 200' extend from substrate 205. By contrast with the structure of FIGS. 2A-2C, fins 200' are illustrated as having a tapered shape, with a narrower upper portion and a wider lower portion. In addition, an isolation material 230, such as an oxide, is disposed between individual fins 200'.

In the discussion with respect to FIGS. 3A-11C, multi-layer semiconductor structures are formed between spacers 210 (see FIGS. 3A-3C). FIG. 2D illustrates one example of a completed structure, showing a cross-section along a gate structure and multiple layers disposed over multiple fins 200'. For example, the multiple layers include a dielectric layer 220, a first reacted layer 221, a second reacted layer 222, and a fill layer 223. Formation of the dielectric layer 220, first reacted layer 221, and second reacted layer 222 are described below with respect to FIGS. 3A-11C. In one embodiment, fill layer 223 can be tungsten, aluminum, or any conductive material, and can provide a flat top profile of the gate structure, following the profile of the spacers 210 (see FIGS. 2A-2C).

FIGS. 3A-3C are cross-sectional elevational views of the semiconductor structure of FIGS. 2A-2C taken along lines 3A-3C thereof, in accordance with one or more aspects of the present invention. As illustrated, sidewall spacers 210 are disposed over fin structure 200.

Each figure of FIGS. 3A-3C illustrates a corresponding gate structure of transistors of FIGS. 2A-2C, taken along a corresponding line (e.g., lines 3A-3A, 3B-3B, and 3C-3C) thereof. This labeling convention is followed below with each numbered series of figures, with each lettered figure within the numbered series illustrating the same corresponding gate structure in the subsequent fabrication step.

The gate structures are formed as multilayer structures within sidewall spacers 210, which are used as forms or molds, to confine the gate material during the fabrication processing steps described below. The gate structures can be formed as part of a gate-first or a gate-last process. In a gate first process, the gate is formed before establishment of source and drain regions of transistors (which may include heat treatment), and in a gate last process, the gate is formed after the establishment of source and drain regions. The gate structures may also be formed in a replacement gate process. In a replacement gate process, sacrificial gates are formed, and then, at least partially, removed. Sidewall spacers 210 may be any suitable insulator material, such as silicon dioxide, silicon nitride, silicon oxynitride, silicon carbon nitride, silicon carbon oxide.

FIGS. 4A-4C illustrate the semiconductor structure of FIGS. 3A-3C after providing a dielectric layer 400 over fin structure 200, in accordance with one or more aspects of the present invention. Dielectric layer 400 can include one or more materials, and can have the same materials or different materials in the different regions of the semiconductor structure.

In one example, dielectric layer 400 can be a material including silicon, such as silicon dioxide, or silicon oxynitride. In another example, dielectric layer 400 can be a high dielectric constant (high-k) material having a dielectric constant greater than, for example, approximately 3.9 (the dielectric constant of silicon dioxide), including, but not limited to one or more of hafnium oxide, tantalum oxide, zirconium oxide, titanium oxide, or aluminum oxide. In one specific example, dielectric layer 400 can be a high-k material having a thickness of approximately between 5 Å and 25 Å. In another example, other material layers can be included. For instance, another layer may be deposited between the substrate and the dielectric layer to facilitate adhesion of the dielectric layer.

FIGS. 5A-5C illustrate the semiconductor structure of FIGS. 4A-4C after providing a semiconductor layer 500 above the substrate in first region 201 (FIG. 4A) and second region 202 (FIG. 4B) thereof, in accordance with one or more aspects of the present invention. In one embodiment, semiconductor layer 500 includes silicon, such as amorphous silicon. In the illustrated embodiment, the semiconductor layer is not disposed in third region 203 (FIG. 4C). Deposition of various layers can be prevented in one or more regions by masks that are placed over those regions using photolithographic patterning and masking methods. For instance, semiconductor layer 500 can have a thickness of between 1 nanometer (nm) and 10 nanometers. In addition, semiconductor layer 500 can be deposited using chemical vapor deposition (CVD), atomic layer deposition (ALD), physical vapor deposition (PVD), or furnace techniques.

FIGS. 6A-6C illustrate the semiconductor structure of FIGS. 5A-5C after providing a first layer 600 above fin structure 200 thereof, in accordance with one or more aspects of the present invention. In one embodiment, first layer 600 includes a first metal, such as nickel, titanium, or platinum. In another embodiment, first layer 600 can be approximately 2-10 nanometers (nm) thick. First layer 600 can be deposited using atomic layer deposition (ALD) or sputtering.

FIGS. 7A-7C illustrate the semiconductor structure of FIGS. 6A-6C after providing a second layer 700 above fin structure 200 thereof, in accordance with one or more aspects of the present invention. In one embodiment, second layer 700 includes a second metal, such as nickel, titanium, or platinum. In another embodiment, the first metal of first layer 600 and the second metal of second layer 700 are different metals. In a further embodiment, second layer 700 can be approximately 2-10 nm thick. Second layer 700 can be deposited using ALD or sputtering.

FIGS. 8A-8C illustrate the semiconductor structure of FIGS. 7A-7C after implanting silicon 800 at least partially within first layer 600 and second layer 700 in second region 202 and third region 203 thereof, in accordance with one or more aspects of the present invention. In one embodiment, silicon can be implanted with an energy of approximately 1-5 kilo electron volts (keV) with a dose of between $10^{12}$-$10^{15}$ ions per $cm^2$, so that the atoms are mainly located at the interface between first layer 600 and second layer 700. For example, gas cluster ion beam (GCIB) techniques can be used to implant silicon 800 with the appropriate energy to ensure that the silicon reaches the desired location.

FIGS. 9A-9C illustrate the semiconductor structure of FIGS. 8A-8C after implanting nitrogen 900 at least partially within first layer 600 and second layer 700 in third region 203 thereof, in accordance with one or more aspects of the present invention. In one embodiment, nitrogen can be implanted by ion implantation, or gas cluster ion beam (GCIB) techniques with energy of approximately 1-5 keV with a dose of between $10^{12}$-$10^{15}$ ions per $cm^2$. The energy can be optimized so that the nitrogen can reach a particular depth as needed.

Figure 10C:
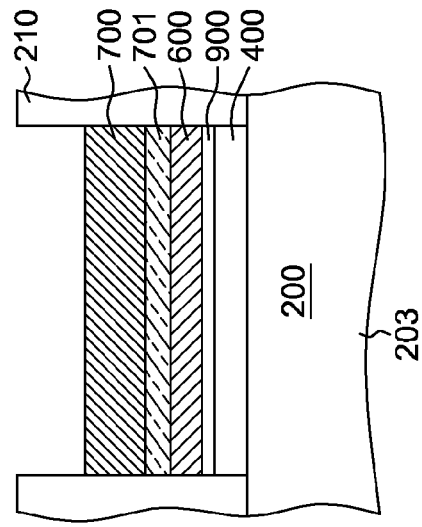
FIGS. 10A-10C illustrate the semiconductor structure of FIGS. 9A-9C after annealing at a first temperature the first layer and the second layer thereof, in accordance with one or more aspects of the present invention.
Figure 10B:
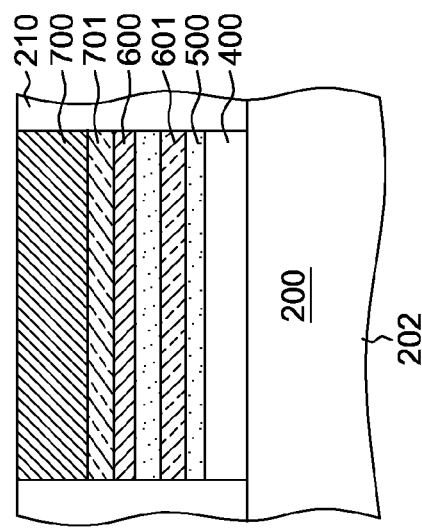
Figure 10A:
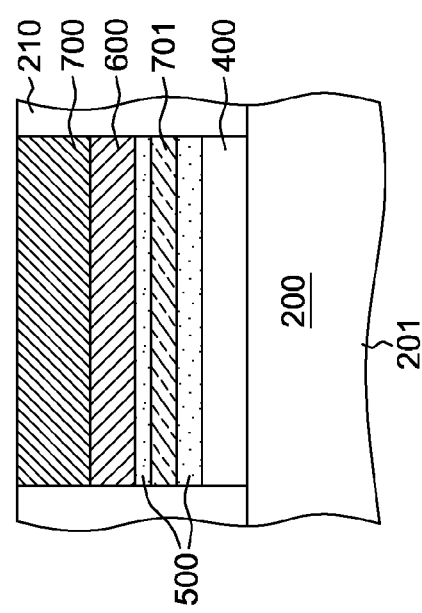

FIGS. 10A-10C illustrate the semiconductor structure of FIGS. 9A-9C after annealing at a first temperature first layer 600 and second layer 700 thereof, in accordance with one or more aspects of the present invention. In one embodiment, the annealing can be rapid thermal annealing at a temperature between 250°-350° C. During the annealing, at least a portion of the second metal of the second layer can react (for example, with silicon) to form a second reacted layer 701, without reacting the first metal of the first layer. In such a case, if the first metal of the first layer is titanium, and the second metal layer is nickel, annealing at the first temperature can react nickel with silicon to form nickel silicide without reacting the titanium. For example, during annealing at the first temperature, nickel can move into silicon to form $Ni_2Si$, and because the first temperature is low enough titanium will not react.

FIGS. 11A-11C illustrate the semiconductor structure of FIGS. 10A-10C after annealing at a second temperature first layer 600 and second layer 700 thereof, in accordance with one or more aspects of the present invention. In one embodiment, annealing at the second temperature can be rapid thermal annealing at a temperature between 300°-450° C. In another embodiment, annealing at the second temperature can be rapid thermal annealing at a temperature between 600°-700° C., or millisecond laser spike annealing (LSA). In a further embodiment, the annealing can include annealing at a temperature between 300°-450° C. followed by annealing, such as LSA, at a third temperature between 600°-700° C. Continuing with the example discussed with reference to FIGS. 10A-10C, during annealing at the second temperature, the previously formed $Ni_2Si$ can be converted to NiSi, the presence of nitrogen in the third region can inhibit formation of TiSi in the third region, and can drive nitrogen into the Ti lattice to form TiN. In addition, during annealing at the third temperature, the overall resistance of the structures can be reduced, and in the third region, NiSi can be formed on TiN.

In one embodiment, the annealing results in reacting at least a portion of the first metal of first layer 600 to form a first reacted layer 601 (FIGS. 11A & 11B) in first region 201 and second region 202, and a first reacted layer 602 (FIG. 11C) in third region 203. In addition, the annealing results in reacting at least a portion of the second metal of second layer 700 to form a second reacted layer 701. In one example, first reacted layer 601 includes a first metal silicide, such as titanium silicide. In another example, second reacted layer 701 includes a second metal silicide, such as nickel silicide. In a further example, first reacted layer 602 includes a first metal nitride, such as titanium nitride or nickel nitride. In another embodiment, a gate contact material, such as aluminum or tungsten, can be deposited within sidewall spacers 210.

Advantageously, the techniques described above result in three different final gate structures being formed between sidewall spacers 210 in first region 201, second region 202, and third region 203. For instance, with reference to FIG. 11A, in first region 201, a gate stack can include first reacted layer 601 disposed above second reacted layer 701. In addition, with reference to FIG. 11B, in second region 202, a gate stack can include second reacted layer 701 disposed above first reacted layer 601, which is the opposite order of reacted layers as in first region 201 (FIG. 11A). Further, with reference to FIG. 11C, in third region 203, a gate stack can include second reacted layer 701 disposed above first reacted layer 602, which can include different materials than first reacted layer 601. As explained above with respect to FIG. 2D, in an embodiment including fin structures and fin-type transistors, the different multi-layer gate structures formed between the sidewall spacers can conformally wrap up and around a fin structure. In another embodiment, the different multi-layer gate structures can be disposed over substrate 205 to allow for planar transistors. In another embodiment, the same fabrication processes described above can be employed to allow for some fin-type transistors in one region (with the gate structures conformally wrapping up and around fin structures) and other planar transistors in another region (with the gate structures being, for example, flat).

In one specific example, in which the first metal is titanium, and the second metal is nickel, first region 201 (FIG. 11A) can have a gate stack appropriate for p-type transistors, because nickel silicide located directly above dielectric layer 400 can be used to set the appropriate work function, and thereby threshold voltage, for p-type transistors. In addition, second region 202 (FIG. 11B) can have a gate stack appropriate for n-type transistors, because titanium suicide located directly above dielectric layer 400 can be used to set the appropriate work function, and thereby threshold voltage, for n-type transistors. Further, third region 203 (FIG. 11C) can have a gate stack appropriate for transistors with a different threshold voltage than those in first region 201 or second region 202, because titanium nitride located directly above dielectric layer 400 can be used to set the appropriate work function, and thereby a threshold voltage, for such applications. In further embodiments, other pairs of first metal and second metal can be used by, for example, tuning the first, second and third temperatures and/or the annealing times. For example, other pairs of first metal and second metal include: titanium and aluminum; nickel and aluminum; platinum and nickel; cobalt and platinum; chromium and platinum; nickel and chromium.

The techniques described above can be extended to create more than three different types of gate structures in more than three regions. For instance, some gate structures can be subsequently implanted with one or more different species in order to further tune the threshold voltage of the transistors. For example, implantation can include erbium (Er), ytterbium (Yb), yttrium (Yt), zirconium (Zr), vanadium (V), scandium (Sc), gadolinium (Gd), molybdenum (Mo), selenium (Se) or any combination thereof. In such a manner, numerous different threshold voltages may be achieved, such as regular, low, and super low threshold voltages for each of p-type and n-type devices.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
fabricating a semiconductor structure, the fabricating comprising:
providing a first layer and a second layer above a substrate, the first layer comprising a first metal and the second layer comprising a second metal, wherein the second layer is disposed over the first layer and the first metal and second metal are different metals; and
annealing the first layer and the second layer to react at least a portion of the first metal of the first layer to form a first reacted layer and at least a portion of the second metal of the second layer to form a second reacted layer, wherein at least one of the first reacted layer or the second reacted layer comprises at least one of a first metal silicide of the first metal or a second metal silicide of the second metal, wherein said annealing comprises annealing at a first temperature to facilitate the second metal reacting but not the first metal reacting.

2. The method of claim 1, wherein the first layer and the second layer comprise a first region and a second region, and the method further comprises:
implanting, before the annealing, silicon at least partially within the first layer and the second layer in the second region but not in the first region, wherein the first reacted layer is formed over the second reacted layer in the first region and the second reacted layer is formed over the first reacted layer in the second region, the first reacted layer comprising the first metal silicide and the second reacted layer comprising the second metal silicide.

3. The method of claim 2, wherein the fabricating further comprises:
fabricating a first transistor in the first region and a second transistor in the second region, the first transistor comprising a first gate structure and the second transistor comprising a second gate structure, wherein the first gate structure comprises the first reacted layer and the second reacted layer in the first region and the second gate structure comprises the first reacted layer and the second reacted layer in the second region.

4. The method of claim 3, wherein the first transistor is a p-type transistor and the second transistor is an n-type transistor, and the second reacted layer in the first region facilitates electrical operation of the p-type transistor and the first reacted layer in the second region facilitates electrical operation of the n-type transistor.

5. The method of claim 1, wherein the [forming comprises forming the] first reacted layer is formed over the second reacted layer, the first reacted layer comprising the first metal silicide and the second reacted layer comprising the second metal silicide.

6. The method of claim 1, further comprising:
implanting, before the annealing, silicon at least partially within the first layer and the second layer, wherein the at least a portion of the second metal of the second layer reacts with at least some of the silicon to form the second reacted layer over the first reacted layer, the second reacted layer comprising the second metal silicide.

7. The method of claim 6, wherein the first reacted layer comprises the first metal silicide.

8. The method of claim 6, further comprising:
implanting, before the annealing, nitrogen at least partially below the first layer, wherein the at least a portion of the first metal of the first layer reacts with at least some of the nitrogen to form the first reacted layer, the first reacted layer comprising a first metal nitride of the first metal.

9. The method of claim 1, wherein annealing at the first temperature facilitates the second metal diffusing through the first layer.

10. The method of claim 1, wherein annealing at the first temperature facilitates the second metal reacting to form the second metal silicide of the second reacted layer.

11. The method of claim 1, further comprising:
annealing at a second temperature the first layer and the second layer, wherein annealing at the second temperature facilitates the first metal reacting but not the second metal reacting.

12. The method of claim 11, wherein the second temperature is greater than the first temperature.

13. The method of claim 11, wherein annealing at the second temperature facilitates the first metal diffusing through the second layer.

14. The method of claim 11, wherein annealing at the second temperature facilitates the first metal reacting to form the first metal silicide of the first reacted layer.

15. The method of claim 11, further comprising:
annealing at a third temperature the first layer and the second layer, wherein annealing at the third temperature facilitates forming the first reacted layer and the second reacted layer.

16. The method of claim 1, wherein the first metal comprises one of titanium or nickel and the second metal comprises the other of titanium or nickel.

17. The method of claim 1, wherein the first metal silicide comprises one of titanium silicide or nickel silicide, and the second metal silicide comprises the other of titanium silicide or nickel silicide.

18. The method of claim 1, wherein the first layer comprises nickel, the first reacted layer comprises nickel silicide, the second layer comprises titanium, and the second reacted layer comprises titanium silicide.

* * * * *